(12) United States Patent
Kawanishi (10) Patent No.: US 8,076,830 B2
(45) Date of Patent: Dec. 13, 2011

(54) PIEZOELECTRIC VIBRATING PIECES, AND PIEZOELECTRIC VIBRATORS AND OSCILLATORS COMPRISING SAME

(75) Inventor: Shingo Kawanishi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 12/655,201

(22) Filed: Dec. 23, 2009

(65) Prior Publication Data

US 2010/0164332 A1 Jul. 1, 2010

(30) Foreign Application Priority Data

Dec. 25, 2008 (JP) .................................. 2008-330206

(51) Int. Cl.
*H01L 41/08* (2006.01)
(52) U.S. Cl. ........................................................ 310/370
(58) Field of Classification Search .................. 310/370, 310/367–368, 311; 331/156; *H03H 9/21, H03H 9/215*
See application file for complete search history.

(56) References Cited

U.S. PATENT DOCUMENTS

| | | | |
|---|---|---|---|
| 6,587,009 B2 * | 7/2003 | Kitamura et al. | 331/158 |
| 7,084,556 B1 * | 8/2006 | Dalla Piazza et al. | 310/370 |
| 7,352,117 B2 * | 4/2008 | Kawanishi et al. | 310/370 |
| 7,397,172 B2 | 7/2008 | Kikushima | |
| 7,659,798 B2 * | 2/2010 | Yamada | 333/200 |

FOREIGN PATENT DOCUMENTS

| | | |
|---|---|---|
| JP | 2003-133895 | 5/2003 |
| JP | 2004-236008 | 8/2004 |
| JP | 2004-350015 | 12/2004 |
| JP | 2006-148856 | 6/2006 |
| JP | 2006-340392 | 12/2006 |

OTHER PUBLICATIONS

Office action for related Japanese Application No. 2008-330206, dated Mar. 23, 2011, 4 pages.

* cited by examiner

*Primary Examiner* — Thomas M Dougherty
*Assistant Examiner* — Karen Addison
(74) *Attorney, Agent, or Firm* — Klarquist Sparkman, LLP

(57) ABSTRACT

Piezoelectric vibrating pieces are disclosed that include a base portion and first and second vibrating arms extending in a longitudinal direction from the base portion. Each vibrating arm has first and second main surfaces, a first groove on the first main surface, and a second groove on the second main surface. The grooves extend in the longitudinal. By adjusting the length and shapes of at least the first grooves relative to each other, the rigidity of the vibrating arms can be balanced and adverse effects of deformed regions between the vibrating arms caused by anomalous etching can be reduced.

14 Claims, 7 Drawing Sheets

PIEZOELECTRIC VIBRATING PIECES, AND PIEZOELECTRIC VIBRATORS AND OSCILLATORS COMPRISING SAME

CROSS-REFERENCE TO RELATED APPLICATION

This application claims priority to and the benefit of Japan Patent Application No. 2008-330206, filed on Dec. 25, 2008, in the Japan Patent Office, the disclosure of which is incorporated herein by reference in its entirety.

FIELD

This disclosure pertains to, inter alia, piezoelectric vibrating pieces of which grooves are formed on the vibrating arms, and to piezoelectric vibrators and oscillators comprising such a piezoelectric vibrating piece.

DESCRIPTION OF THE RELATED ART

Piezoelectric oscillators including a piezoelectric vibrating piece are used in many small data devices, such as HDDs (Hard Disc Drives), mobile computers, IC cards, and clock sources for mobile phones. A conventional "tuning-fork type piezoelectric vibrating piece" comprises a roughly rectangularly-shaped base portion from which a pair of vibrating arms extend. Electrical energization of the vibrating arms causes them to vibrate relative to the base portion, in the manner of a tuning fork. Conventionally, the outline profile of a tuning-fork type piezoelectric vibrating piece is formed by wet-etching a unit of piezoelectric material such as a quartz-crystal wafer. Grooves and electrodes, used for energizing ("driving") the arms to vibrate, are formed on one or both main surfaces (upper and lower) of the vibrating arms. Whenever a driving voltage is applied, via the electrodes, to the tuning-fork type piezoelectric vibrating piece, the distal ends of the vibrating arms oscillate from side to side (called "flexural movement") to generate a designated frequency signal.

The tuning-fork type piezoelectric vibrating piece disclosed in Japan Unexamined Patent Application No. 2003-133895 includes a base portion and a pair of vibrating arms extending from the base portion in a designated direction. Respective symmetrical grooves are formed on both main surfaces of each vibrating arm. In a plan view of a main surface, the ends of the groove are box-shaped, U-shaped, or V-shaped, for example.

A "piezoelectric vibrating device" as used herein is a piezoelectric vibrating piece contained in a package, such as a ceramic or ceramic-and-glass package. A "piezoelectric oscillator" as used herein is a piezoelectric vibrating device including one or more built-in (in the package) electronic circuit(s) (e.g., integrated circuits) used for driving the arms to vibrate and/or extracting the vibration energy (at the desired vibration frequency) from the device.

Loss of oscillation energy from the vibrating arms desirably is kept low. The CI value of a tuning-fork type piezoelectric vibrating piece can be reduced by forming the grooves on one or both main surfaces of the vibrating arms. Tuning-fork type piezoelectric vibrating pieces suitable for use in piezoelectric oscillators must produce vibrations at extremely high accuracy. By way of example, a common vibration frequency produced by a piezoelectric oscillator is 32,768 kHz. Such an oscillator, being contained in a package, can be mounted and used in any of various accurate circuits or devices, such as a clock device.

The tuning-fork type piezoelectric vibrating piece disclosed in Japan Unexamined Patent Application No. 2004-236008 includes a base portion and a pair of vibrating arms extending from the base portion in a designated longitudinal direction (e.g., Y-direction). Between the vibrating arms, at the base portion is a "crotch." Distally from the crotch extends the longitudinal space between the vibrating arms. The crotch includes a notch extending in the same direction as the vibrating arms. Whereas the notch desirably is located at the center-line (extending in the X-direction) of the base portion, the notch may be located closer, along the X-direction line, to one vibrating arm than to the other vibrating arm. Such an asymmetric or misdirected notch can cause one vibrating arm to be more rigid than the other vibrating arm.

A proper notch helps the vibrating arms to oscillate well and reduces the CI value associated with flexural movement of the vibrating arms. To such end, according to the JP '008 reference, the notch can be located slightly off-center to correct a differential rigidity in the vibrating arms. For example, if one arm is more rigid than the other, the notch can be positioned to reduce the higher rigidity slightly and thereby restore the desired balanced rigidity of both arms. Otherwise, when arms of differing rigidity vibrate, the oscillation produced by the vibrating arms is degraded.

One cause of a notch unintentionally displaced from the center line is an etching anisotropy arising during a wet-etching process for forming the vibrating arms and base. For example, an etching anisotropy may be caused by etching in one region not being to the same extent as in another region, which causes the profile of the crotch to be deformed relative to specification. For example, the deformity can cause the notch to be displaced on the center line or to be misoriented relative to the longitudinal direction, which changes the rigidity of one vibrating arm relative to the rigidity of the other. Consequently, the oscillation of the vibrating arms becomes unbalanced.

In miniaturized tuning-fork type piezoelectric vibrating pieces as discussed in the JP '895 reference, grooves are formed on the vibrating arms. The grooves have identical shapes and are symmetrical. In view of the high degree of miniaturization of the vibrating pieces, these specifications place extreme demands on the wet-etching process used for forming the crotch, which can make it difficult to produce, especially on a consistent basis, oscillators exhibiting balanced oscillations of the vibrating arms. With increased miniaturization of tuning-fork type piezoelectric vibrating pieces, the space between the vibrating arms becomes progressively narrower and the crotch becomes progressively smaller. The narrower space is more difficult to wet-etch evenly, which increases the probability of producing defective product. Ie., as the space becomes smaller, an etching anisotropy may result in a greater portion of the crotch (or notch thereof) being deformed, relative to less miniaturized product. A relatively larger deformed region can have a more pronounced adverse effect on oscillation balance.

The present invention provides a solution to the problems summarized above. Provided are piezoelectric vibrating pieces and piezoelectric vibrators and oscillators comprising the piezoelectric vibrating pieces. The pieces, vibrators, and oscillators reduce adverse effects caused by deformed crotches and notches arising from, for example, etching anomalies.

SUMMARY

According to a first aspect of the invention, piezoelectric vibrating pieces are provided. An embodiment of such a piezoelectric vibrating piece comprises a base portion and first and second vibrating arms. The first and second vibrating arms extend in a designated longitudinal direction (e.g., Y-direction) from the base portion. Each vibrating arm has first and second main surfaces. A first groove is defined in the first main surface and a second groove is defined in the second main surface of each vibrating arm. Each groove extends in the longitudinal direction, wherein at least the first grooves are not symmetrical with each other about a center-line extending in the longitudinal direction between the first and second vibrating arms. By adjusting the shapes of at least the first grooves in this manner, any unbalanced rigidity of the vibrating arms [caused by, e.g., the presence of a deformed portion or other etching anisotropy situated in the region (e.g., crotch region) between the vibrating arms] can be prevented or rectified.

In certain embodiments, whereas each first groove has a proximal end and a distal end, the proximal ends are nearer the base portion than the distal ends, and the proximal ends have similar shapes but different coordinates in the longitudinal direction. According to this configuration, the particular vibrating arm having more rigidity than the other is provided with a longer groove at least on the first main surface thereof. Thus, the rigidity of the first and second vibrating arms can be balanced.

By way of example, the proximal ends of each first groove can be box-shaped ⊔, U-shaped, V-shaped, unilaterally curved shaped, or unilaterally stepped shaped.

In other embodiments, the proximal ends of at least the first grooves are nearer the base portion than the distal ends, wherein the proximal ends have different shapes. Thus, the particular vibrating arm having greater rigidity than the other arm can be provided with, for example, a larger proximal region of the groove on at least the first main surface. Thus, the rigidity of the vibrating arms can be balanced.

Various combinations of shapes of the proximal ends are possible. As a first example, the proximal end of the first groove in the first vibrating arm can be U-shaped, while the proximal end of the first groove in the second vibrating arm is box-shaped. The box shape can provide a slightly larger proximal end than the U-shape. As a second example, the proximal end of the first groove in the first vibrating arm can be V-shaped, while the proximal end of the first groove in the second vibrating arm is box-shaped. The box shape provides a slightly larger proximal end than the V-shape. As a third example, the proximal end of the first groove in the first vibrating arm can be V-shaped, while the proximal end of the first groove in the second vibrating arm is U-shaped. The U-shape provides a slightly larger proximal end than the V-shape. These configurations provide ways to balance the rigidity of the vibrating arms.

In other embodiments the first groove in each of the first and second arms have similar lengths in the longitudinal direction. Also, the first groove in each of the first and second arms have similar shapes, and the proximal end of the first groove in each of the first and second arms is asymmetric about a respective longitudinal center line of the respective groove. By providing at least the first grooves in the vibrating arms with such asymmetry, rigidity of the vibrating arms is brought into balance. By way of example, the proximal end of the first groove in each of the first and second arms can have a unilaterally curved shape or a unilaterally stepped shape.

In yet other embodiments, the second grooves on the second main surfaces can also be configured so as not to be symmetrical with each other about a center-line extending in the longitudinal direction between the first and second vibrating arms. This asymmetry can be the same as on the first main surfaces, or different. For example, the proximal ends of the first grooves can have similar shapes but different coordinates in the longitudinal direction, and the proximal ends of the second grooves can have similar shapes but different coordinates in the longitudinal direction.

According to a second aspect, piezoelectric vibrators are provided that comprise a piezoelectric vibrating piece as summarized above, and a package containing the piezoelectric vibrating piece. By incorporating a piezoelectric vibrating piece as summarized above, a higher proportion of the piezoelectric vibrators produced on an assembly line exhibit an oscillation frequency within specification.

According to a third aspect, piezoelectric oscillators are provided that comprise a piezoelectric vibrating piece as summarized above, at least one integrated circuit, and a package containing the integrated circuit(s) and the piezoelectric vibrating piece.

The various aspects summarized above provide piezoelectric vibrating pieces in which the rigidity of the vibrating arms can be balanced, and the adverse effects of any deformities (especially asymmetric deformities) between the vibrating arms caused by etching anisotropies or the like can be reduced by adjusting the length and shapes of the grooves formed on the vibrating arms. Thus, a higher proportion of vibrators and oscillators produced on an assembly line exhibit oscillation frequencies that are within specification.

DETAILED DESCRIPTION

Preferred embodiments are described below with reference to the figures. The described embodiments do not limit the scope of the invention unless stated otherwise.

First Embodiment of Tuning-Fork Type Piezoelectric Vibrating Piece

Figure 1A:
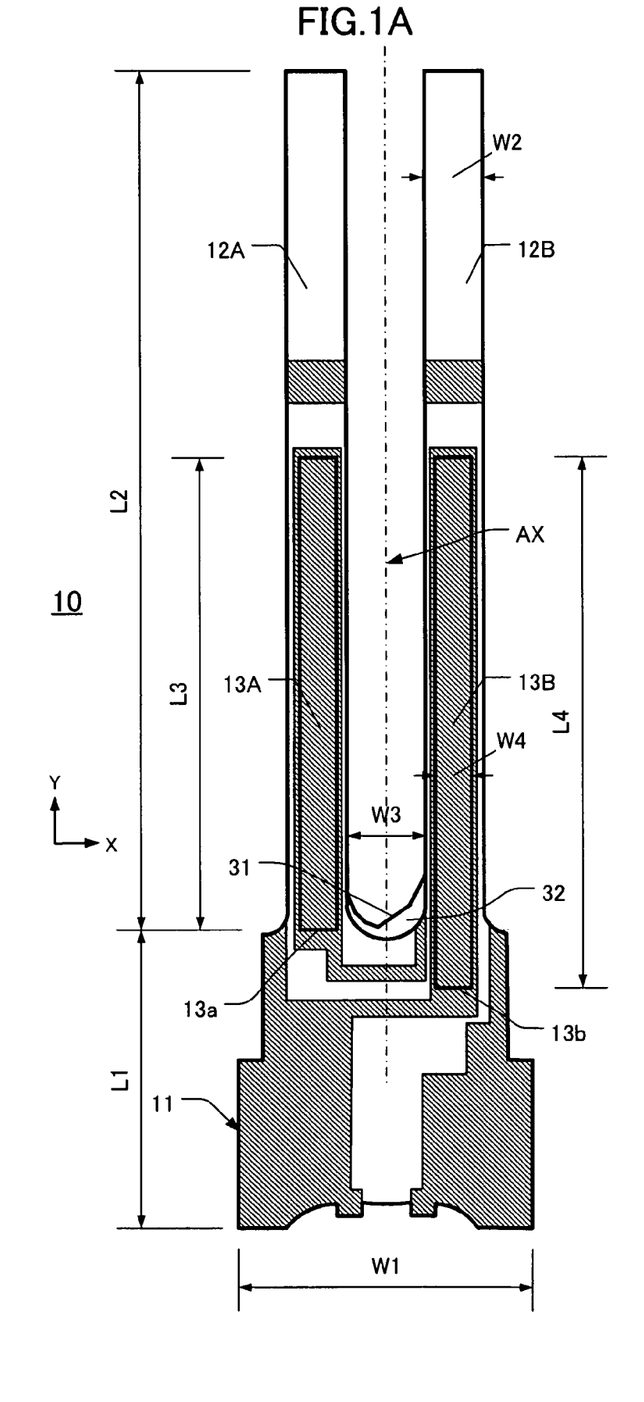
FIG. 1A is a plan view of a first embodiment of a tuning-fork type piezoelectric vibrating piece, in which the proximal ends of the grooves are square-shaped (box-shaped).
Figure 1B:
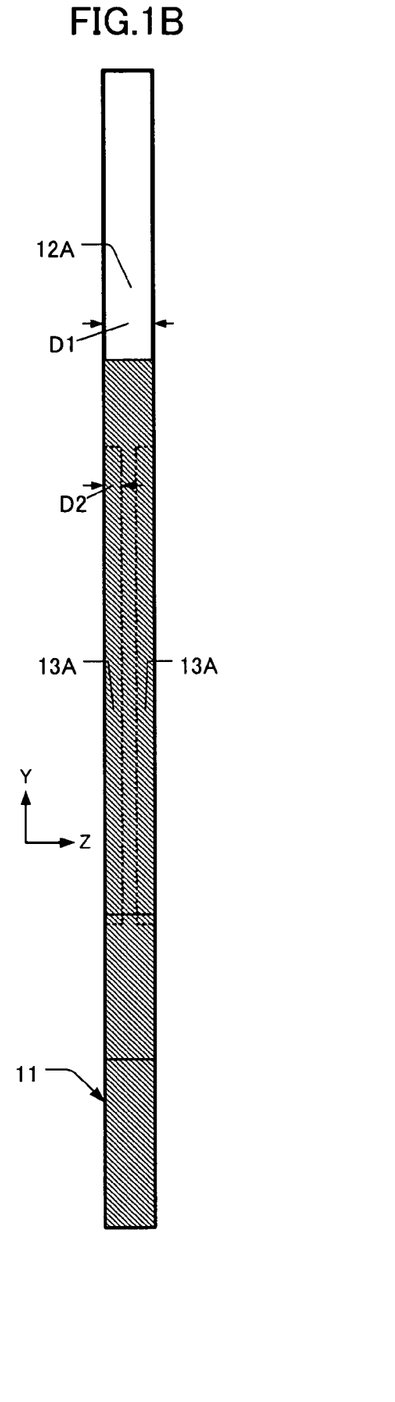
FIG. 1B is an orthogonal view of the longitudinal edge of the tuning-fork type piezoelectric vibrating piece shown in FIG. 1A.

A tuning-fork type piezoelectric vibrating piece 10 according to the first embodiment is described with reference to FIGS. 1A and 1B and FIGS. 2A and 2B. FIG. 1A is a plan view and FIG. 1B is an orthogonal edge view from the –X-direction side. As shown in FIG. 1A, the tuning-fork type piezoelectric vibrating piece 10 comprises a base portion 11, a first vibrating arm 12A, and a second vibrating arm 12B. The vibrating arms 12A, 12B extend longitudinally (Y-direction) from the base portion 11. The vibrating arms 12A, 12B define first and second grooves 13A, 13B, respectively. The grooves 13A, 13B have different Y-direction lengths and are formed on the upper main surface of the respective vibrating arm 12A, 12B. The proximal portions of the grooves 13A, 13B (i.e., portions nearest the base portion 11) have respective ends 13a, 13b. In the depicted embodiment, these ends 13a, 13b are box-shaped. "Box-shaped" means that the ends extend straight across in the X-direction. Between the vibrating arms 12A, 12B is a crotch 31. The area of the crotch 31 nearer the first vibrating arm 12A is etched more deeply than the area of the crotch nearer the second vibrating arm 12B. As a result, the crotch 31 has a fin-like deformed region 32.

Exemplary dimensions of the tuning-fork type piezoelectric vibrating piece 10 are as follows: The length L1 (in the Y-direction or longitudinal direction) of the base portion 11 is 0.58 mm to 0.64 mm. The length L2 (in the Y-direction or longitudinal direction) of the first and second vibrating arms 12A, 12B extending from the base portion 11 is 1.45 mm to 1.65 mm. Hence, the length L1 is approximately 40% of the length L2. The length L3 of the groove 13A is in the range of approximately 60% to 70% of the length L2, i.e., 0.87 mm to 1.12 mm. The length L4 of the groove 13B is in the range of approximately 61% to 75% of the length L2, i.e., 0.90 mm to 1.30 mm. Hence, the second groove 13B is 0.03 mm to 0.17 mm longer than the first groove 13A. The extra length of the second groove 13B extends over the proximal region of the base portion 11, compared to the first groove 13A. Therefore, the first and second grooves 13A, 13B are not entirely line-symmetric about the centerline (axis) AX, which is centerline between the vibrating arms 12A, 12B.

Further regarding exemplary dimensions, the width WI of the base portion 11 is approximately 0.42 mm to 0.50 mm, and the width W2 of each vibrating arm 12A, 12B is 0.08 mm to 0.12 mm. As a result, the width W3 of the space between the vibrating arms 12A, 12B is 0.1 mm to 0.15 mm. The width W4 of each groove 13A, 13B is approximately 80% of the width W2, i.e., approximately 0.07 mm to 0.1 mm.

As denoted in FIG. 1B by dotted lines, a first groove 13A is defined in each of the upper and lower main surfaces of the first vibrating arm 12A. Consequently, a cross-section of the grooved region of the first vibrating arm 12A is H-shaped. The first and second vibrating arms 12A, 12B both have such double grooves. The main function of the grooves 13A, 13B is to suppress increases in CI value of the piezoelectric vibrating piece.

Further with respect to exemplary dimensions, the thickness D1 (in the z-direction) of the tuning-fork type piezoelectric vibrating piece 10 is approximately 0.08 mm to 0.12 mm, which is the same thickness as of a single-crystal wafer. Each groove has a depth D2 that is 30% to 40% of the thickness D1, i.e., 0.3 mm to 0.45 mm.

An electrode pattern (not shown) is formed on the base portion 11, the first vibrating arm 12A, and the second vibrating arm 12B. The electrode pattern comprises a gold (Au) top-layer of 200 to 3000 Angstroms thickness layered on a sub-layer of chromium (Cr) having a thickness of 50 to 700 Angstroms. Instead of chromium (Cr), the sub-layer can be made of tungsten (W), nickel (Ni), or titanium (Ti). Instead of gold (Au), the top layer can be of silver (Ag). Moreover, the electrode pattern can comprise a single gold layer and an aluminum (Al) layer. The electrode pattern can include or be a corrosion-resistant film for use during etching.

Because of the presence of the deformed region 32, associated more with the second vibrating arm 12B than with the first vibrating arm 12A, in the crotch 31, the rigidity of the first vibrating arm 12A is less and thus unbalanced relative to the second vibrating arm 12B. But, in this embodiment, by configuring the first groove 13A shorter than the second groove 13B, the rigidity of the first vibrating arm 12A is made substantially equal to the rigidity of the second vibrating arm 12B. Also, any adverse effects possibly caused to oscillation of the vibrating arms 12A, 12B are reduced. Therefore, this embodiment of a tuning-fork type piezoelectric vibrating piece 10 exhibits reduced loss of oscillation from the vibrating arms and a small CI value, even after being miniaturized. Also, the rigidity of the vibrating arms 12A, 12B, is balanced.

Figure 2A:
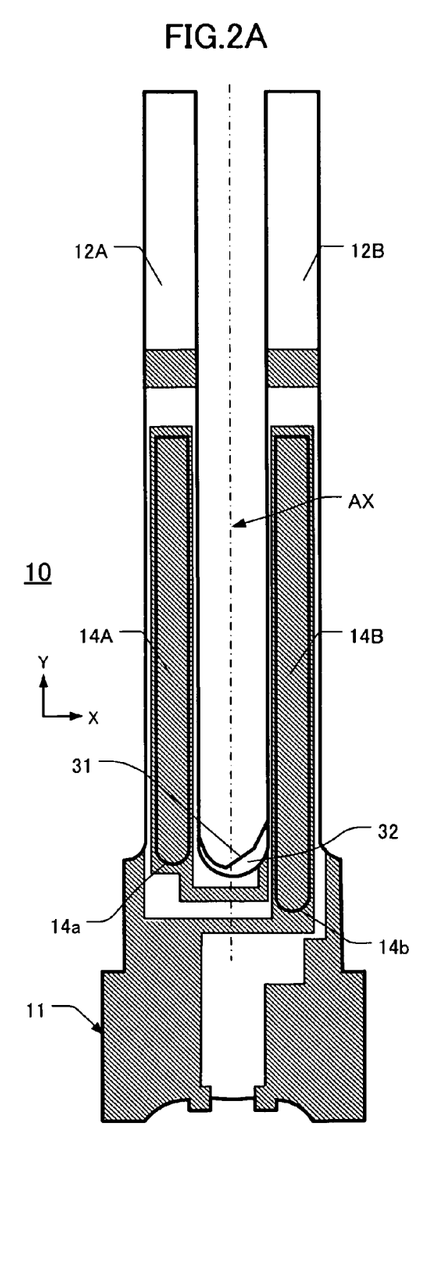
FIG. 2A is a plan view of the first embodiment of a tuning-fork type piezoelectric vibrating piece, in which the proximal ends of the grooves are U-shaped.
Figure 2B:
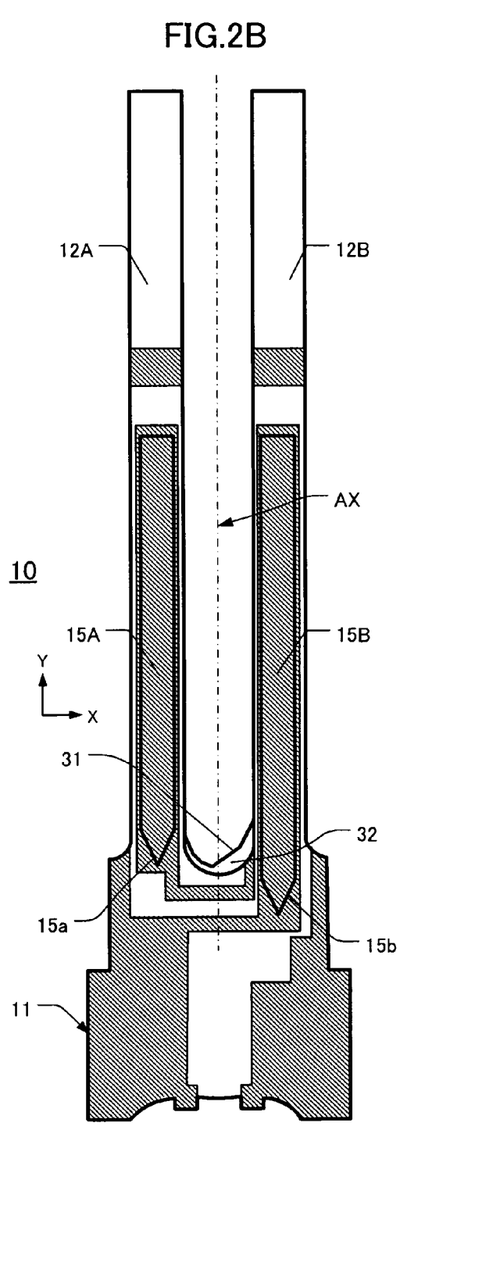
FIG. 2B is a plan view of the first embodiment of a tuning-fork type piezoelectric vibrating piece, in which the proximal ends of the grooves are V-shaped.

As shown in FIG. 2A, the proximal ends 14a, 14b of the grooves 14A, 14B, respectively, can be U-shaped; alternatively, as shown in FIG. 2B, the proximal ends 15a, 15b of the grooves 15A, 15B, respectively, can be V-shaped. "U-shaped" means that the subject end of the groove is semicircular. "V-shaped" means that the subject end of the groove is defined by crossed straight lines arranged at ±45 degrees to ±70 degrees from the X-direction. The U-shaped and V-shaped proximal ends 14a, 14b, and 15a, 15b, respectively, reduce stress concentrations caused whenever extreme force is being applied to the vibrating arms 12A, 12B, compared to the box-shaped proximal ends 13a, 13b shown in FIG. 1A. The U-shaped and V-shaped proximal ends also reduce breakage of the vibrating arms. Further, the CI value can be reduced even after the piezoelectric vibrating piece 10 has been miniaturized and the rigidity of the vibrating arms balanced.

Second Embodiment of Tuning-Fork Type Piezoelectric Vibrating Piece

Figure 3A:
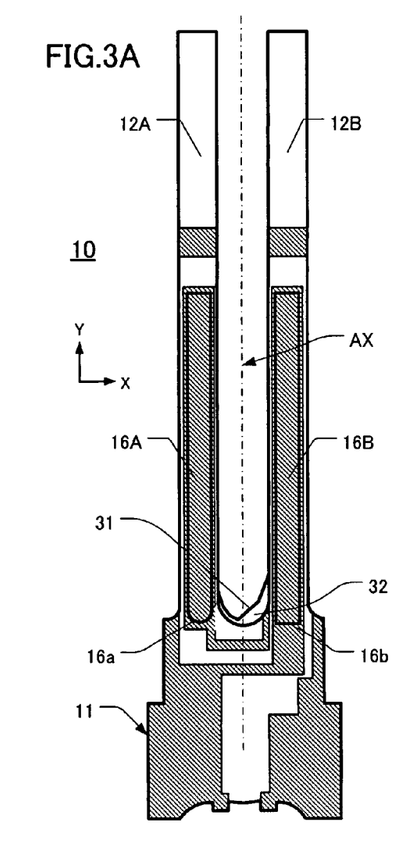
FIG. 3A is a plan view of a second embodiment of a tuning-fork type piezoelectric vibrating piece, in which the proximal ends of respective grooves are square-shaped and U-shaped, respectively.
Figure 3B:
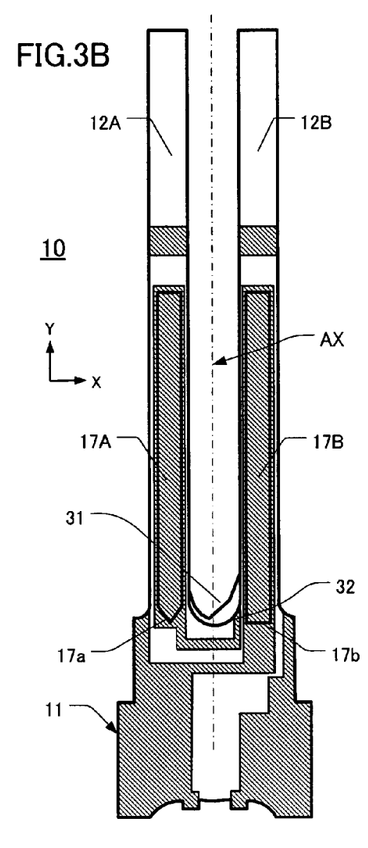
FIG. 3B is a plan view of the second embodiment of a tuning-fork type piezoelectric vibrating piece, in which the proximal ends of respective grooves are box-shaped and V-shaped, respectively.
Figure 3C:
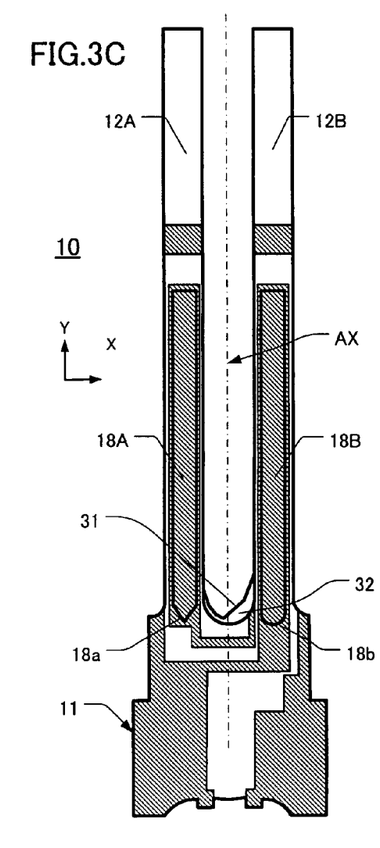
FIG. 3C is a plan view of the second embodiment of a tuning-fork type piezoelectric vibrating piece, in which the proximal ends of respective grooves are V-shaped and U-shaped, respectively.

This embodiment 10 is described with reference to FIGS. 3A, 3B, and 3C. FIG. 3A is a plan view of a configuration in which the proximal ends of the grooves 16A, 16B are U-shaped 16a and square-shaped 16b, respectively. FIG. 3B is a plan view of a configuration in which the proximal ends of the grooves 17A, 17B are V-shaped 17a and box-shaped 17b, respectively. FIG. 3C is a plan view of a configuration in which the proximal ends of the grooves 18A, 18B are V-shaped 18a and U-shaped 18b. Compared to the first embodiment, the only differences in the second embodiment are the lengths of the grooves and the shapes of the proximal ends of the grooves. Hence, further description of elements that are the same in both embodiments is omitted. Also, components in both embodiments that are similar have the same respective reference numerals.

In FIG. 3A the crotch 31 is more etched adjacent the first vibrating arm 16A compared to adjacent the second vibrating arm 16B. Hence, the deformed portion 32 is closer to the second vibrating arm 16B than to the first vibrating arm 16B. Consequently, the first vibrating arm 16A has less rigidity than the second vibrating arm 16B, which disrupts the desired balanced rigidity of the vibrating arms. To compensate, the proximal end 16a of the first groove 16A is U-shaped, and the proximal end 16b of the second groove 16B (having the same length as the first groove 16A) is box-shaped rather than U-shaped. As a result, the first and second grooves 16A, 16B are not line-symmetrical about the center-line AX (which is the longitudinal center-line between the first and second vibrating arms 16A, 16B. But, this asymmetry serves to balance the respective rigidities of the first and second vibrating arms 16A, 16B, which in turn reduces adverse effects of the deformity.

In a similar fashion, referring now to FIG. 3B, the proximal end 17a of the first groove 17A can be V-shaped, and the proximal end 17b of the second groove 17B can be box-shaped. Referring to FIG. 3C, the proximal end 18a of the first groove 18A can be V-shaped, and the proximal end 18b of the second groove 18B can be U-shaped. These examples of differently shaped proximal ends have the same beneficial effects as exhibited by the piezoelectric vibrating piece 100 shown in FIG. 3A. That is, the CI value is reduced, even after the piezoelectric vibrating piece 10 has been miniaturized and the rigidity of the vibrating arms is balanced.

Third Embodiment of Tuning-Fork Type Piezoelectric Vibrating Piece

Figure 4A:
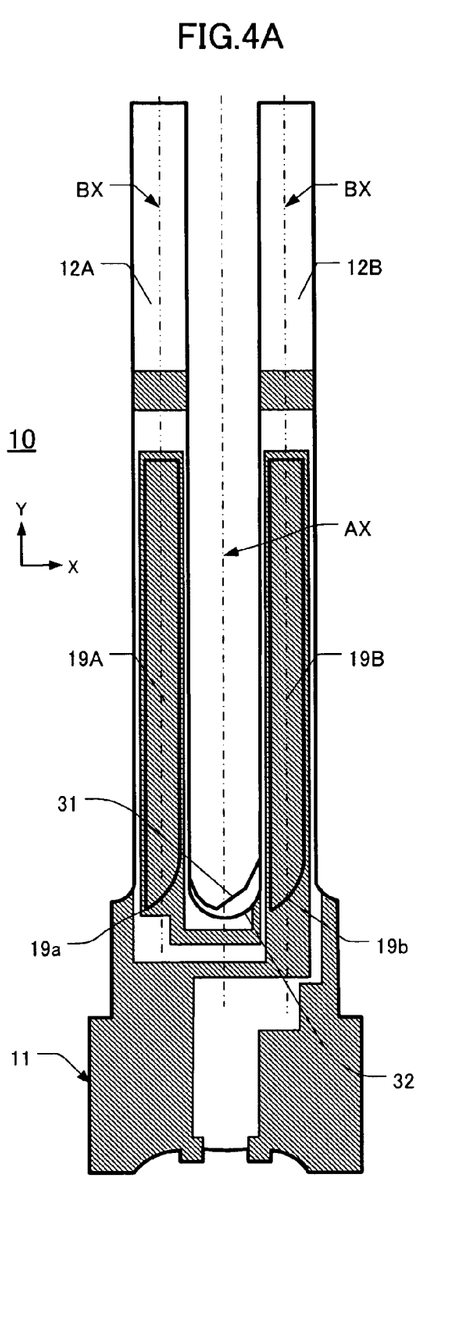
FIG. 4A is a plan view of a third embodiment of a tuning-fork type piezoelectric vibrating piece, in which the proximal ends of the grooves are unilaterally curved.
Figure 4B:
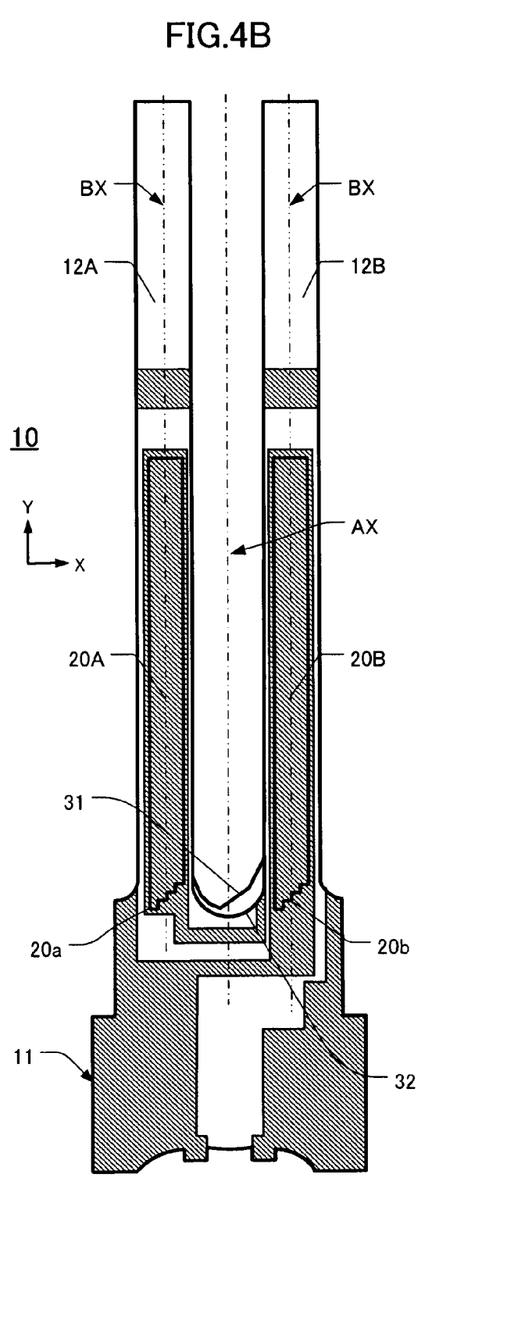
FIG. 4B is a plan view of the third embodiment of a tuning-fork type piezoelectric vibrating piece, in which the proximal ends of the grooves are unilaterally stepped.

This embodiment 10 of a tuning-fork type piezoelectric vibrating piece is described with reference to FIGS. 4A and 4B. FIGS. 4A and 4B are plan views of two configurations of a tuning-fork type piezoelectric vibrating piece 10 according to this embodiment. In FIG. 4A the proximal end of the groove 19A has a unilaterally curved profile. As a result, the proximal end 19a of the vibrating arm 12A is linearly asymmetrical about the center-line BX (which is the longitudinal center-line of the groove 19A in the Y-direction). The proximal end 19b of the second vibrating arm 12B has the same shape as item 19a.

Turning now to FIG. 4B, the proximal ends 20a, 20b of the grooves 20A, 20B both have a unilateral stepped (stair-like) profile. As a result, each proximal end 20a, 20b is linearly asymmetrical about the respective center-line BX. Since only the respective shapes of the proximal ends of the grooves in the third embodiment are different from corresponding features in the second embodiment, features that are similar in both embodiments have the same respective reference numerals and are described further.

In FIG. 4A the crotch 31 is more etched adjacent (in the −X-direction) the first vibrating arm 12A than adjacent (in the +X-direction) the second vibrating arm 12B. Hence, the deformed region 32 is closer to the second vibrating arm 12B than to the first vibrating arm 12A. Alone, this asymmetry of the crotch 31 can unbalance the rigidity of the vibrating arms 12A, 12B. To compensate, the proximal ends 19a, 19b of the grooves 19A, 19B are "beveled" in the manner shown, which causes more material to be absent on the −X side of the line BX than on the +X side. This asymmetry in the proximal ends restores equal rigidity of both vibrating arms 12A, 12B, despite the presence of the deformed region 32.

The unilaterally stepped profile of the proximal ends 20a, 20b of the first and second grooves 20A, 20B, respectively, shown in FIG. 4B produce the same beneficial effect as the proximal-end configurations 19a, 19b in FIG. 4A. Hence, even if the piezoelectric vibrating piece 10 of FIG. 4A or 4B is miniaturized, its CI value can be kept low and the respective rigidities of the vibrating arms can be balanced. The proximal ends 20a, 20b also reduce any detrimental effect on vibrations that otherwise would arise from the presence of the etch-deformed region 32.

In this embodiment the grooves 19A, 19B and 20A, 20B have substantially the same length and their respective proximal ends 19a, 19b and 20a, 20b have substantially identical shapes. Alternatively, the vibrating arm on which the groove 19A or 20A are formed having lesser rigidity can be formed shorter than the vibrating arm on which respective groove 19B or 20B are formed having higher rigidity, as described in the first embodiment.

FIRST ALTERNATIVE EXAMPLE

Figure 5A:
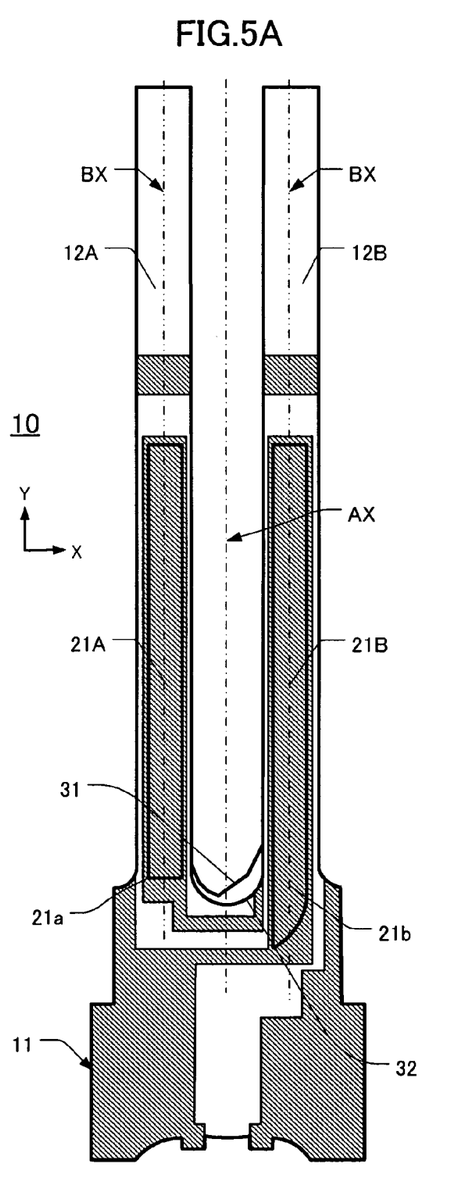
FIG. 5A is a plan view of a first alternative example of a tuning-fork type piezoelectric vibrating piece, in which the proximal ends of respective grooves are box-shaped and unilaterally curved, respectively.
Figure 5B:
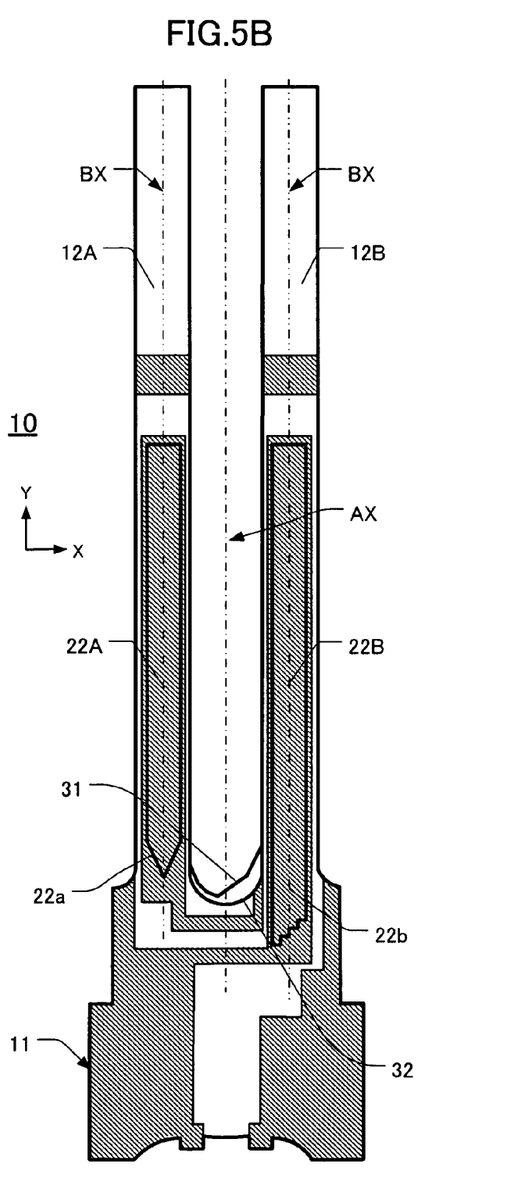
FIG. 5B is a plan view of the first alternative example of a tuning-fork type piezoelectric vibrating piece, in which the proximal ends of respective grooves are V-shaped and unilaterally stepped, respectively.

This example of the tuning-fork type piezoelectric vibrating piece 10 is described with reference to FIGS. 5A and 5B. FIGS. 5A and 5B are both plan views of respective configurations of the tuning-fork type piezoelectric vibrating piece 10. The proximal end 21a of the first groove 21A is box-shaped (FIG. 5A), and the proximal end 21b of the second groove 21B, which is longer than the groove 21A, is unilaterally curved to render the proximal end 21b asymmetric about the center-line BX. In FIG. 5B, the proximal end 22a of the first groove 22A is V-shaped, and the proximal end 22b of the second groove 22B, which is longer than the groove 22A, is unilaterally stepped to render the proximal end 22b asymmetric about the center-line BX. In both FIGS. 5A and 5B, only the shapes of the proximal ends of the grooves are different; all other features are similar to corresponding features described in the first embodiment and have the same respective reference numerals.

Further regarding FIG. 5A, the crotch 31 is more widely etched on the side nearer the first vibrating arm 12A than on the side nearer the second vibrating arm 12B. Hence, the deformed region 32 is associated predominantly with the second vibrating arm 12B. This results in the first vibrating arm 12A having less rigidity than the second vibrating arm 12B, which unbalances the rigidity of the vibrating arms. This unbalance is offset by making the proximal end 21 a of the first groove 21 A box-shaped, making the proximal end 21b of the second groove 21B unilaterally curved, and making the second groove 21B longer than the first groove 21A. This configuration equalizes the rigidity of both arms 12A, 12B.

In FIG. 5B the proximal end 22a of the first groove 22A is V-shaped and the proximal end 22b of the second groove 22B is unilaterally stepped. Also, the second groove 22B is longer than the first groove 22A. These features provide the same beneficial effect as the configuration shown in FIG. 5A. Hence, even if the piezoelectric vibrating piece 10 is miniaturized, its CI value can be kept low, and the rigidity of the pair of vibrating arms can be kept balanced despite the presence of the etching anisotropy.

In other optional configurations, the proximal end of the groove in the first vibrating arm 12A can be V-shaped or U-shaped, and the proximal end of the groove in the second vibrating arm 12B can be unilaterally curved. Further alternatively, the proximal end of the groove on the first vibrating arm 12A can be U-shaped or box-shaped, and the proximal end of the groove on the second vibrating arm 12B can be unilaterally stepped (stair-like).

Second Alternative Example

Figure 6A:
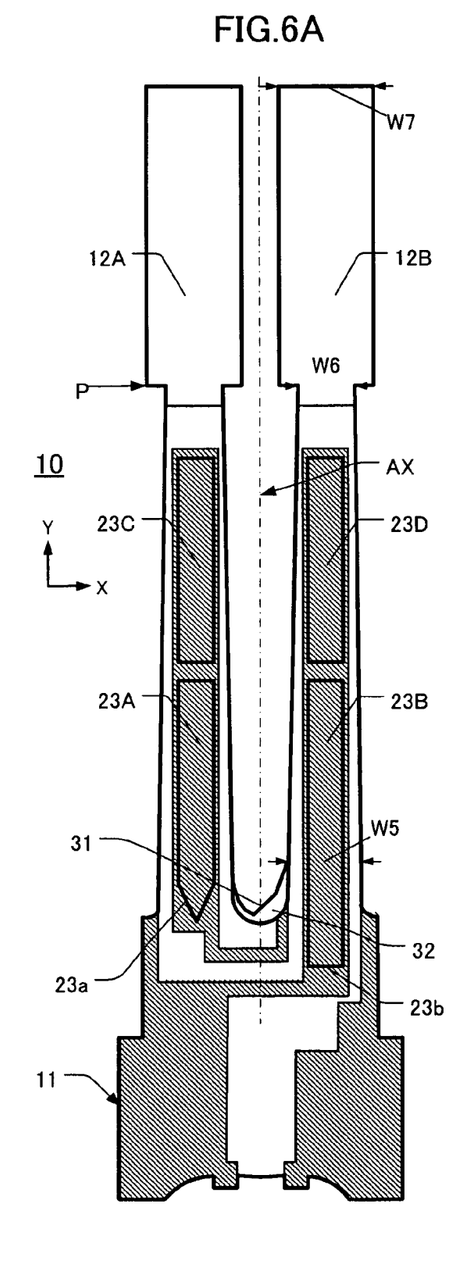
FIG. 6A is a plan view of a second alternative example of a tuning-fork type piezoelectric vibrating piece, in which the proximal ends of the grooves are different and in which the distal ends of the vibrating arms have a hammer-head configuration.
Figure 6B:
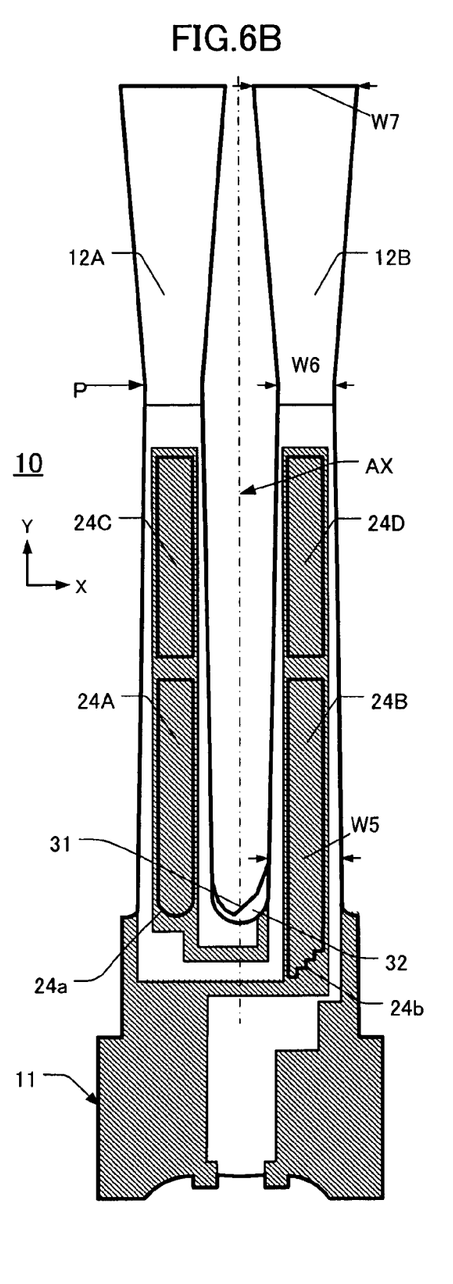
FIG. 6B is a plan view of the second alternative example of a tuning-fork type piezoelectric vibrating piece, in which the proximal ends of the grooves are different and in which he distal ends of the vibrating arms progressively increase in width.

This example is described with reference to FIGS. 6A and 6B. FIG. 6A is a plan view of one configuration of this example, in which the distal ends of the vibrating arms have a hammer-head profile. FIG. 6B is a plan view of another configuration of this example, in which the distal ends of the vibrating arms progressively widen. In FIG. 6A, the crotch 31 is more widely etched nearer the first vibrating arm 12A than nearer the second vibrating arm 12B. The deformed region 32 is nearer the second vibrating arm 12B. The depicted main surface of each vibrating arm 12A, 12B defines two longitudinal grooves, namely first and second grooves 23A, 23C on the first vibrating arm 12A and first and second grooves 23B, 23D on the second vibrating arm 12B. Each groove, being longitudinal, extends in the Y-direction. Each second groove 23C, 23D has box-shaped proximal and distal ends. With respect to the first grooves 23A, 23B, the distal ends are box-shaped and the proximal ends are V-shaped (as in the second embodiment) and box-shaped (as in the first embodiment), respectively. In addition, the groove 23B is longer in the −Y-direction than the groove 23A (as in the first embodiment). Also, in FIG. 6A, each vibrating arm 12A, 12B gradually narrows with increasing distance in the +Y-direction to the line P (i.e., the arm narrows from the width W5 to the width W6, wherein W5>W6). The width W6 is at the line P. Also, at the line P, each vibrating arm has a hammer-head having a width W7>X6, wherein W7 is also greater than W5. The width W7 is substantially constant over the hammer-head.

In this alternative example, an deformed region 32 is situated in the crotch 31, which causes an unbalanced rigidity of the first vibrating arm 12A relative to the second vibrating arm 12B. As described in the first, second, and third embodiments, as well as in the first alternative example, the respective lengths and/or shapes of the proximal ends 23a, 23b can be manipulated to restore equal rigidity to the first and second vibrating arms 12A, 12B. Also, the CI value can be suppressed by dividing the first and second grooves into two respective portions to increase arm rigidity and reduce stresses otherwise caused by flexive movements of the arms. Reduction of CI value and suppression of second-harmonic oscillations can also be achieved by selecting the location of the line P at which the width of the first and the second vibrating arms 12A, 12B is changed.

As a result of the vibrating arms 12A, 12B gradually narrowing with distance in the +Y-direction (from the proximal ends to the distal ends), the rigidity of the arms at the base portion 11 is increased where the largest stresses and flexures occur during oscillation of the vibrating arms 12A, 12B. Thus, flexural movements of the vibrating arms 12A, 12B are rendered more stable, with more suppression of unnecessary components of movement. This, in turn, lowers the CI value of tuning-fork type piezoelectric vibrating piece 10, even after it has been miniaturized. Also, detrimental effects of the etching anisotropies are reduced.

FIG. 6B is a plan view of an alternative example. In FIG. 6B the proximal end 24a of the first groove 24A is U-shaped (as in the second embodiment), and the proximal end 24b of the second groove 24B is unilaterally stepped (stair-like), as in the third embodiment. As in the first embodiment, the first groove 24A is shorter than the second groove 24B. Also, each vibrating arm 12A, 12B gradually narrows from the proximal width W5 to the line P (distal width W6), wherein W5>W6. From the line P, each vibrating arm 12A, 12B widens to the width W7 at the extreme distal end of the arm, wherein W7>W6. In this example, other features that are similar to corresponding features in FIG. 6A have the same reference numerals and are not described further.

The configuration shown in FIG. 6B provides the same benefits as the configuration shown in FIG. 6A. That is, even if miniaturized, the tuning-fork type piezoelectric vibrating piece 10 exhibits a low CI value and balanced rigidity of the two vibrating arms, despite the presence of an etching anisotropy.

Piezoelectric Vibrators and Oscillators

Figure 7A:
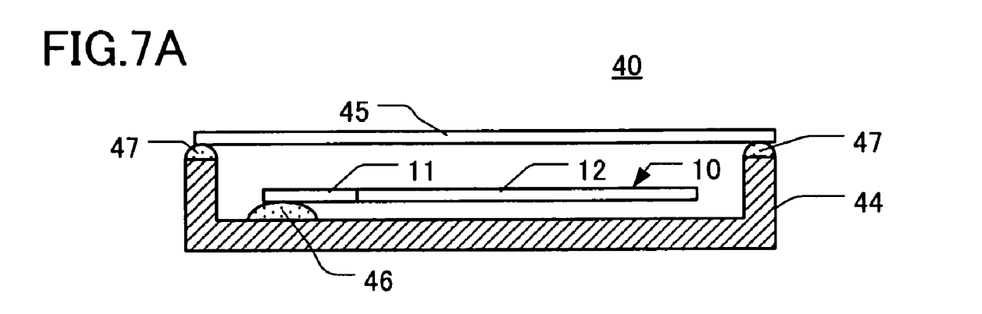
FIG. 7A is an elevational section of an embodiment of a piezoelectric device comprising a tuning-fork type piezoelectric vibrating piece mounted inside a package.

Respective embodiments of a piezoelectric vibrator 40 and of a piezoelectric oscillator 50 are described with reference to FIGS. 7A and 7B, respectively. In these figures, similar features have similar respective reference numerals.

Any of the embodiments of a tuning-fork type piezoelectric vibrating piece 10 as described above is suitable for inclusion in, for example, a piezoelectric vibrator 40 that must provide highly accurate vibration frequency even if miniaturized. Such a piezoelectric vibrator comprises a tuning-fork type piezoelectric vibrating piece 10 configured to produce an oscillation at a frequency of, for example, 32.768 kHz. FIG. 7A is an elevational section of an embodiment of a piezoelectric vibrator 40 comprising a tuning-fork type piezoelectric vibrating piece 10 contained in a package 44 made of ceramic, for example. An electrically conductive adhesive 46 is applied on an extraction electrode (not shown) formed on a surface of the base portion 11 of the tuning-fork type piezoelectric vibrating piece 10. Using the adhesive 46, the tuning-fork type piezoelectric vibrating piece 10 is mounted on an interior surface of the package 44. Then, a lid 45 is bonded to the package 44 using a sealing material 47, thereby sealing the tuning-fork type piezoelectric vibrating piece 10 inside the package 44.

Figure 7B:
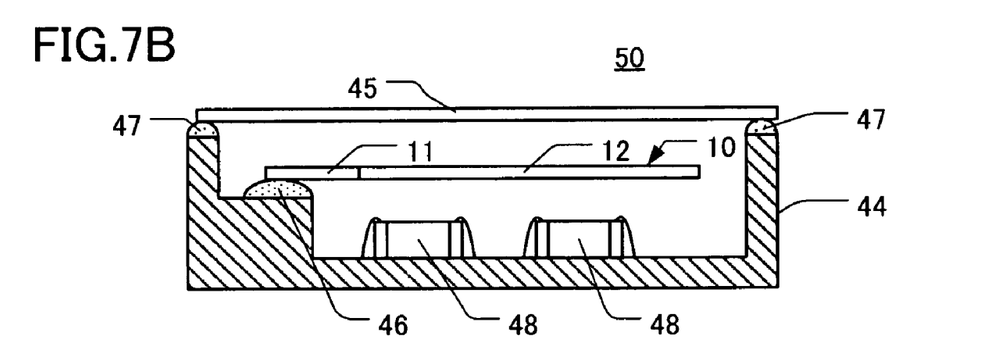
FIG. 7B is an elevational section of an embodiment of a piezoelectric oscillator comprising a tuning-fork type piezoelectric vibrating piece and integrated circuits mounted inside a package.

FIG. 7B is an elevational section of a piezoelectric oscillator 50 comprising the tuning-fork type piezoelectric vibrating piece 10 and one or more integrated circuits 48 mounted inside the ceramic package 44. The integrated circuits 48 are mounted on the interior surface of the package 44, beneath the tuning-fork type piezoelectric vibrating piece 10. The tuning-fork type piezoelectric vibrating piece 10 is mounted to the package using electrically conductive adhesive 46, as described above regarding FIG. 7A. A lid 45 is bonded to the package using sealing material 47. Inside the package 44, as the tuning-fork type piezoelectric vibrating piece 10 oscillates, the oscillations are input to the integrated circuits 48. Thus, the piezoelectric oscillator 50 produces an extractable oscillation signal at a designated frequency.

By incorporating any of the tuning-fork type piezoelectric vibrating pieces 10 described above, the piezoelectric vibrator 40 and the piezoelectric oscillator 50 are resistant to producing unwanted frequency components outside a designated frequency range, which provides a lower rate of defects on the assembly line.

The invention has been described above in the context of preferred embodiments. It will be obvious to persons of ordinary skill in the relevant art to modify the invention based on this disclosure, while still remaining within the spirit and scope of the invention.

For example, in the described embodiments the tuning-fork type piezoelectric vibrating piece comprises a pair of vibrating arms in which grooves are defined on both the upper and lower main surfaces thereof. Alternatively, the grooves can be formed on only one main surface of the vibrating arms. Also, the profiles of the ends of the grooves can be any of various other shapes besides U-shaped, V-shaped, unilaterally curved-shaped, or unilaterally stepped shape.

What is claimed is:

1. A piezoelectric vibrating piece, comprising:
a base portion;
a first vibrating arm and a second vibrating arm both extending in a designated longitudinal direction from the base portion, each vibrating arm having first and second main surfaces; and
a respective first groove defined in at least one of the first and second main surfaces of the first vibrating arm, and a respective second groove defined in at least one of the first and second main surfaces of the second vibrating arm, each of the first and second grooves extending in the longitudinal direction;
wherein the first groove and second groove have different respective lengths in the longitudinal direction, and
the second groove extends further along the longitudinal direction toward the base portion than does the first groove.

2. The piezoelectric vibrating piece of claim 1, further comprising a deformity on the base portion located between the first and second vibrating arms, the deformity extending more toward the second vibrating arm than toward the first vibrating arm.

3. The piezoelectric vibrating piece of claim 2, wherein:
the first groove and second groove each have a respective proximal end; and
the proximal end of the first groove and the proximal end of the second groove are similar as viewed from a direction normal to the main surface.

4. The piezoelectric vibrating piece of claim 3, wherein the respective proximal end of each groove has a shape selected from the group consisting of box-shape, U- shape, and V-shape.

5. The piezoelectric vibrating piece of claim 2, wherein:
the first groove and second groove each have a respective proximal end; and
the proximal end of the first groove and the proximal end of the second groove differ from each other as viewed from a direction normal to the main surface.

6. A piezoelectric vibrator, comprising:
a piezoelectric vibrating piece as recited in claim 2; and
a package containing the piezoelectric vibrating piece.

7. The piezoelectric vibrating piece of claim 1, wherein:
the first groove and second groove each have a respective proximal end; and
the proximal end of the first groove and the proximal end of the second groove are similar as viewed from a direction normal to the main surface.

8. The piezoelectric vibrating piece of claim 7, wherein the respective proximal end of each groove has a shape selected from the group consisting of box-shape, U-shape, and V-shape.

9. The piezoelectric vibrating piece of claim 1, wherein:
the first groove and second groove each have a respective proximal end; and
the proximal end of the first groove and the proximal end of the second groove differ from each other as viewed from a direction normal to the main surface.

10. A piezoelectric vibrator, comprising:
a piezoelectric vibrating piece as recited in claim 1; and
a package containing the piezoelectric vibrating piece.

11. A piezoelectric oscillator, comprising:
a piezoelectric vibrating piece as recited in claim 10; and
an integrated circuit mounted in the package and connected to the piezoelectric vibrating piece.

12. A piezoelectric vibrating piece, comprising:
a base portion;
a first vibrating arm and a second vibrating arm extending in a designated longitudinal direction from the base portion;
a first groove and a second groove defined in the first and second main surfaces, respectively, of the first vibrating arm, and a first groove and a second groove defined in the first and second main surfaces, respectively, of the second vibrating arm, each groove extending in the longitudinal direction;
a deformity located on the base portion between the first and second vibrating arms, the deformity extending more toward the second vibrating arm than toward the first vibrating arm; and
each of the first and second grooves comprising a respective proximal end, wherein the proximal end of the second groove has a volume thereof extending toward the base portion that is larger than a volume of the proximal end of the first groove.

13. A piezoelectric vibrator, comprising:
a piezoelectric vibrating piece as recited in claim 12; and
a package containing the piezoelectric vibrating piece.

14. A piezoelectric oscillator, comprising:
a piezoelectric vibrating piece as recited in claim 13; and
an integrated circuit mounted in the package and connected to the piezoelectric vibrating piece.

* * * * *